United States Patent
Tomita et al.

(10) Patent No.: US 6,339,353 B1
(45) Date of Patent: Jan. 15, 2002

(54) INPUT CIRCUIT OF A MEMORY HAVING A LOWER CURRENT DISSIPATION

(75) Inventors: Hiroyoshi Tomita, Tokyo; Naoharu Shinozaki, Fuchu, both of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/542,454

(22) Filed: Apr. 4, 2000

(30) Foreign Application Priority Data

Sep. 20, 1999 (JP) ............................................ 11-266324

(51) Int. Cl.[7] .............................................. H03K 3/356
(52) U.S. Cl. ........................................ 327/210; 327/112
(58) Field of Search ................................ 327/199, 208, 327/210, 211, 212, 214, 112; 326/87

(56) References Cited

U.S. PATENT DOCUMENTS

| | | | |
|---|---|---|---|
| 5,453,708 A | * 9/1995 | Gupta et al. ................... 326/98 |
| 5,463,340 A | * 10/1995 | Takabatake et al. ......... 327/211 |
| 5,801,554 A | 9/1998 | Momma et al. ............... 327/89 |
| 5,905,393 A | * 5/1999 | Rinderknecht et al. ...... 327/202 |
| 6,037,816 A | * 3/2000 | Yamauchi ..................... 327/213 |
| 6,097,230 A | * 8/2000 | Bareither ..................... 327/202 |

* cited by examiner

*Primary Examiner*—Jeffrey Zweizig
(74) *Attorney, Agent, or Firm*—Arent Fox Kintner Plotkin & Kahn, PLLC

(57) ABSTRACT

The present invention provides an input circuit having small current consumption in a clock synchronization type semiconductor integrated circuit. The input circuit is activated by an activation signal to receive an input signal and an activation signal generating circuit generates the activation signal. The activation signal generating circuit activates intermittently the activation signal for a time shorter than a period of a clock signal and including a setup time and a hold time of the input signal in order to activate the input circuit. The input circuit is activated only for the limited time of one period of the clock signal and therefore current consumption can be reduced.

12 Claims, 14 Drawing Sheets

FIRST EMBODIMENT OF INPUT BUFFER OF THE PRESENT INVENTION

INPUT BUFFER CIRCUIT OF THE RELATED ART

TIMING DIAGRAM INDICATING SETUP TIME AND HOLD TIME

FIRST EMBODIMENT OF INPUT BUFFER OF THE PRESENT INVENTION

FIRST EMBODIMENT OF ACTIVATION SIGNAL GENERATING CIRCUIT OF THE PRESENT INVENTION

DIAGRAM ILLUSTRATING AN EXAMPLE OF RELATIONSHIP AMONG CAS LATENCY, MAXIMUM CLOCK FREQUENCY, SETUP TIME AND HOLD TIME

| CL<br>CAS LATENCY | MAXIMUM CLOCK FREQUENCY | tclk<br>MINIMUM CLOCK PERIOD | ts<br>SETUP TIME | th<br>HOLD TIME |
|---|---|---|---|---|
| 1 | 33 | 30 | 2 | 2 |
| 2 | 66 | 15 | 2 | 2 |
| 3 | 100 | 10 | 2 | 2 |
|  | (MHz) | (ns) | (ns) | (ns) |

FIRST EMBODIMENT OF DELAY CIRCUIT OF THE PRESENT INVENTION

FROM FUSE CIRCUIT

Fig.9 SECOND EMBODIMENT OF DELAY CIRCUIT OF THE PRESENT INVENTION

FIRST EMBODIMENT OF PULSE FORMING
CIRCUIT OF THE PRESENT INVENTION

FIRST EMBODIMENT OF FUSE CIRCUIT
OF THE PRESENT INVENTION

SECOND EMBODIMENT OF ACTIVATION SIGNAL GENERATING CIRCUIT OF THE PRESENT INVENTION

Fig.13 SECOND EMBODIMENT OF FUSE CIRCUIT OF THE PRESENT INVENTION

THIRD EMBODIMENT OF ACTIVATION SIGNAL GENERATING CIRCUIT OF THE PRESENT INVENTION

SECOND EMBODIMENT OF INPUT BUFFER
OF THE PRESENT INVENTION

THIRD EMBODIMENT OF INPUT BUFFER
OF THE PRESENT INVENTION

INPUT CIRCUIT OF A MEMORY HAVING A LOWER CURRENT DISSIPATION

BACKGROUND OF THE INVENTION

The present invention relates to a semiconductor integrated circuit and particularly to a clock synchronization type semiconductor memory including an input circuit having low current dissipation. Low power consumption is desirable for a synchronous dynamic random access memory (hereinafter referred to as SDRAM). Therefore, power consumption for an input buffer of a SDRAM must be lowered.

FIG. 1 illustrates a conventional input buffer circuit. The input buffer circuit comprises an input circuit 1 and a latch circuit 2. The input circuit 1 receives an input signal (for example, address signal, control signal, data signal) to be applied to an external terminal. And the latch circuit 2 latches an output signal from the input circuit 1 in synchronization with an internal clock signal iclk. An output of the latch circuit 2 is supplied to an internal circuit. In FIG. 1, numeral 3 designates a clock buffer circuit which receives the external clock CLK applied to the clock signal terminal and supplies the internal clock iclk to internal circuits.

The input circuit 1 comprises, for example, a CMOS inverter. Moreover, the latch circuit 2 comprises inverters 4, 5 and a transfer switch. The inverter 4 is connected to the output of the input circuit 1. The inverter 5 has an input and an output which are cross-connected to the output and the input of the inverter 4. The transfer switch which is provided between the output of the inverter 5 and input of the inverter 4 and is composed of a PMOS transistor P01 and a NMOS transistor n01 connected in parallel. This transfer switch turns ON/OFF in response to the internal clock iclk.

The input circuit 1 receives the input signal applied to the external terminal and outputs a signal which has an inverted logic level to the input signal. When the transfer switch is turned ON in response to the internal clock iclk synchronized with the leading edge of an external clock signal CLK, the latch circuit 2 latches an output of the input circuit 1.

In the input buffer circuit of the related art as illustrated in FIG. 1, the input circuit 1 is always connected to the power supply line. Therefore, the input circuit 1 of the related art consumes a large amount of current. As an example other than FIG. 1, an input circuit has been known in which current consumption is reduced by making non-active the input circuit during a power-down mode.

However, lately, a desire for low current consumption in a SDRAM is moreover increasing and a certain measure for low current consumption is also required for the input buffer circuit.

SUMMARY OF THE INVENTION

Therefore, it is an object of the present invention to provide a semiconductor integrated circuit which assures low current consumption and reduces current consumption in the clock synchronization type semiconductor integrated circuit. Moreover, the present invention is intended to provide an input circuit for an SDRAM that assures low current consumption and reduces current consumption.

The inventors of the present invention have investigated the following to achieve the desired feature explained above.

FIG. 2 is a timing diagram for explaining the setup time and hold time in the input circuit. In the clock synchronization type semiconductor integrated circuit, the input signal (address signal, control signal, etc.) is fetched and latched in response to rise timing of the external clock CLK. The input signal is required to maintain its logic value during the setup time and hold time as explained below.

Namely, in the example of FIG. 1, in order for the latch circuit 2 to latch the input signal applied to the external terminal in synchronization with the external clock CLK, the following is required. That is, the input signal applied to the external terminal must reach the input of the latch circuit 2 via the input circuit 1 and define the logic value of the input signal at the input of the latch circuit 2 before the latch circuit 2 starts a latch operation in response to the rise of the internal clock iclk.

Here, the input signal applied to the external terminal is sent to the latch circuit 2 via several circuits such as the input circuit 1 or the like. Moreover, in FIG. 1, a certain period is necessary until the input of latch circuit 2 is defined from start of signal output from the input circuit 1. Therefore, as illustrated in FIG. 2, the logic value of the input signal to be applied to the external terminal must be defined at least before the setup time ts rather than the rise of the external clock CLK.

Meanwhile, the input signal of the latch circuit 2 must be held until the latch output of the latch circuit 2 is defined. Namely, in FIG. 1, a certain time is required until the clock buffer 3 generates the internal clock iclk from the external clock CLK and the predetermined time is also required until the internal clock iclk is transferred to the latch circuit 2 from the clock buffer 3. If the input signal at the latch circuit 2 ceases immediately after the rise of external clock CLK, the input signal at the input node of the latch circuit is already lost when the latch circuit 2 starts the latch operation in response to the internal clock iclk. Thus, the latch circuit 2 cannot properly latch the input signal.

Therefore, the input signal applied to the external terminal must be held for the period corresponding to the hold time shown in FIG. 2, even after the external clock CLK rises.

For the reasons explained above, the setup time ts and hold time $t_H$ are defined to the input circuit with reference to the rise timing of the external clock signal. And during this period ts+$t_H$, the logic level of the input signal at the external signal terminal must be maintained.

Therefore, the input circuit illustrated in FIG. 1 must be activated during the period corresponding to the setup time and hold time. However, if the input circuit 1 is activated during any other period, not including ts+$t_H$, the input circuit 1 needlessly consumes current.

The present invention saves current consumption of the input circuit 1 by monitoring the input circuit 1 and ensuring that it is activated only during the required period that includes setup time and hold time, which is shorter than one period of the external clock. According to the present invention, the input circuit 1 is activated only for the required period and is inactive during any other period.

Namely, in view of solving the problem explained above, the input circuit in the present invention is intermittently activated during the period corresponding to the setup time and hold time of the input circuit. Since the input circuit is activated for the period corresponding to the setup time and hold time, the input signal can be correctly latched in synchronization with the clock signal as in the case of the related art. Meanwhile, since the input circuit is in an inactive condition during any other period, current consumption in the input circuit is reduced.

Additionally, an output of the input circuit of the present invention is in a high impedance condition when the circuit is in the inactive condition. Therefore, when the input circuit is in the inactive condition, a current is prevented from flowing across the power supply line and output line of the input circuit, thereby reducing current consumption.

Moreover, the present invention also comprises a latch circuit for latching an output signal from the input circuit. The second inverter of which output is connected to the input of a latch circuit among two inverters forming the latch circuit is in a high impedance condition when the latch circuit is inactive. Therefore, when the latch circuit is inactive, a current is prevented from flowing via the second inverter across the input wiring of the latch circuit and power supply line. Thereby, current consumption is reduced.

Moreover, the present invention also comprises an activation signal generating circuit for generating the activation signal to activate the input circuit. This activation signal generating circuit comprises a delay circuit for adjusting the activation timing of the activation signal. Delay time of this delay circuit may be programmed and such delay time is programmed to transition the activation signal to the active condition before the setup time of the input circuit. Thus, current consumption of the input circuit can be reduced by setting the delay time of delay circuit.

Moreover, the other embodiment is structured in such a manner that the delay time of the delay circuit is changed in response to a CAS latency. The maximum frequency of the external clock is changed in response to the selected CAS latency. An effect of the low current consumption of the input circuit can further be improved by changing over the delay time of delay circuit (namely, activation timing of the activation signal) in response to the maximum frequency of the external clock.

Moreover, the activation signal generating circuit of the other embodiment executes the control so that the period of active condition of the activation signal becomes constant independent of the frequency of the input external clock. The maximum effect of the above-mentioned current consumption reduction effect of the input circuit can be extracted by considering the period of active condition to correspond to the total time of the setup time and hold time of the input circuit.

DESCRIPTION OF THE PREFERRED EMBODIMENTS

An outline of the structure of the SDRAM to which the present invention is applied will then be explained with reference to FIG. 3.

Figure 3:
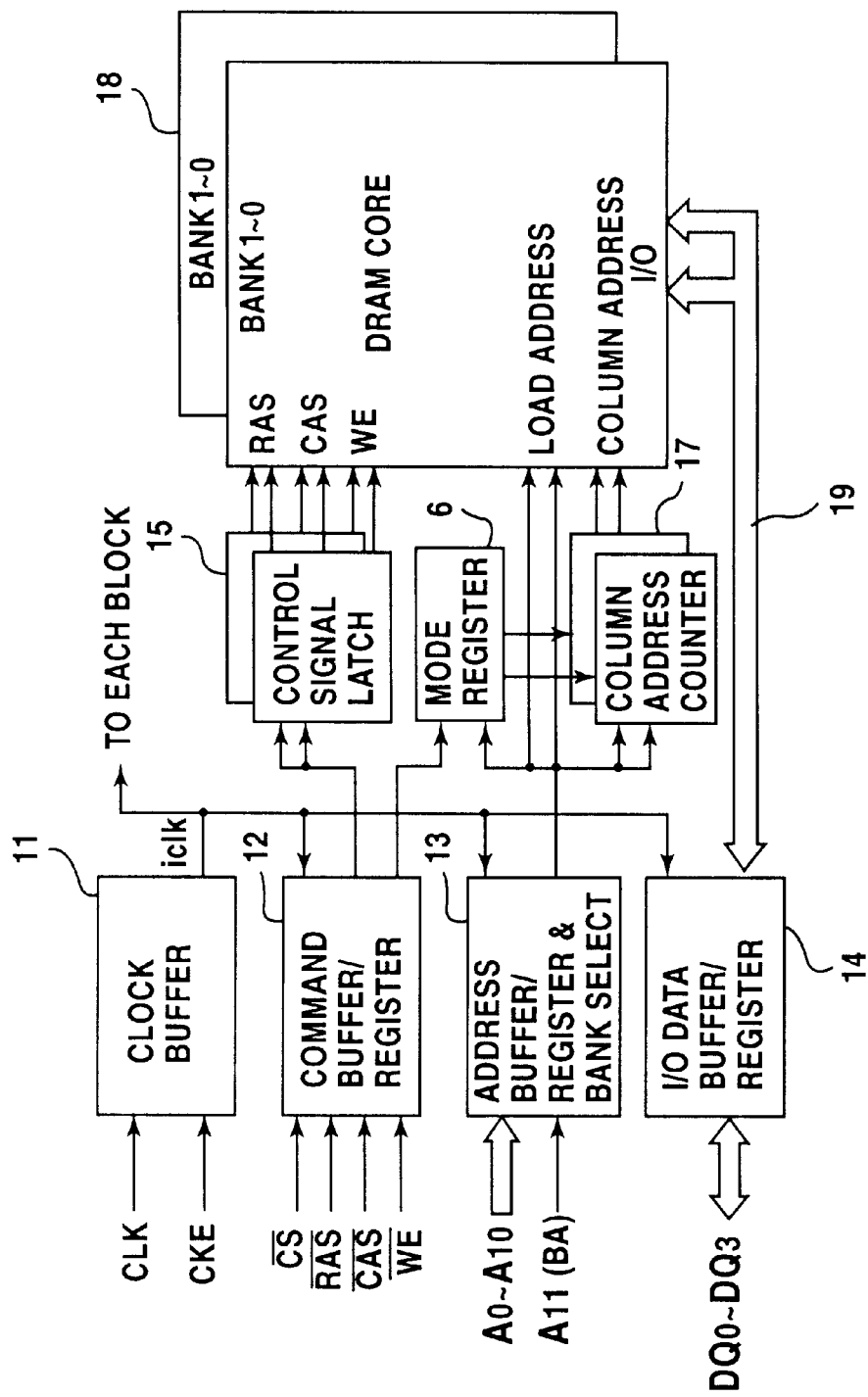
FIG. 3 is block diagram of the SDRAM of the present invention.

In FIG. 3, numeral 11 designates clock buffer; 12, command buffer/register; 13, address buffer/register and bank selecting circuit; 14, I/O data buffer/register; 15, control signal latch; 16, mode register; 17, column address counter; 18, DRAM core; 19, I/O bus, respectively.

Moreover, CLK designates external clock; iclk, internal clock; CKE, clock enable signal; /CS, /RAS, /CAS, /WE, control signals; $A_0$ to $A_{11}$, address signals; $DQ_0$ to $DQ_3$, data signals, respectively.

The clock buffer 11 generates the internal clock iclk by buffering the external clock CLK and then supplies this internal clock iclk to function blocks in the SDRAM. Each function block operates in synchronization with this internal clock iclk. Moreover, the clock buffer 11 receives the clock enable signal CKE. Upon reception of the clock enable signal CKE having a low (L) level at the clock buffer 11, the SDRAM enters a power down mode to inactivate each circuit of the SDRAM including the input circuit to reduce power consumption.

The command buffer/register 12 fetches and latches the control signals /CS, /RAS, /CAS, /WE synchronously with the internal clock signal iclk. These control signals are decoded by the command decoder and thereby one of the operation modes of the SDRAM is determined.

The address buffer/register and bank selecting circuit 13 fetch and latch the address signals $A_0$ to $A_{11}$, synchronously with the internal clock iclk. The address signal A11, among these address signals, is the bank address for selecting the bank explained later and one of the banks 0 and 1 is selected according to this bank address in the example of FIG. 3.

The I/O data buffer/register 14 inputs and outputs the data signals $DQ_0$ to $DQ_3$ synchronously with the internal clock iclk.

The control signal latch 15 outputs various internal control signals RAS, CAS, WE to the DRAM core 18 in response to the operation mode identified by the command buffer/register.

The mode register 16 stores option nodes (burst length, burst type, CAS latency) designated externally. The CAS latency indicates that, in the data read mode, the read data appears at the data output terminals after the number of clocks from an input of a read command (identified through combination of values of a plurality of control signals). These option modes can be stored in the mode register by applying the signal to designate the option mode to the particular address external terminals simultaneously with an input of a mode register set command.

The column address counter 17 generates the internal column address according to the burst length and burst type stored in the mode register 16 when the option mode is set to the burst read (or burst write).

The DRAM core 18 is comprised of a couple of banks (bank 0 and bank 1). Each bank respectively includes a DRAM memory array, a row decoder for selecting the particular word line in the memory array based on the row address, a column decoder for connecting a particular bit line in the memory cell array to the data bus line based on the column address, a sense buffer for amplifying the data read from the data bus line during the read operation and then outputting it to the I/O bus and a write amplifier for amplifying the write data appearing on the I/O bus at the time of write operation and then outputting the write data to the data bus line.

Each function circuit in the DRAM core is controlled in its operation based on the internal control signals RAS, CAS, WE.

The input buffer circuit of the present invention can be applied to the command buffer, address buffer and input data buffer in FIG. 3

Figure 4:
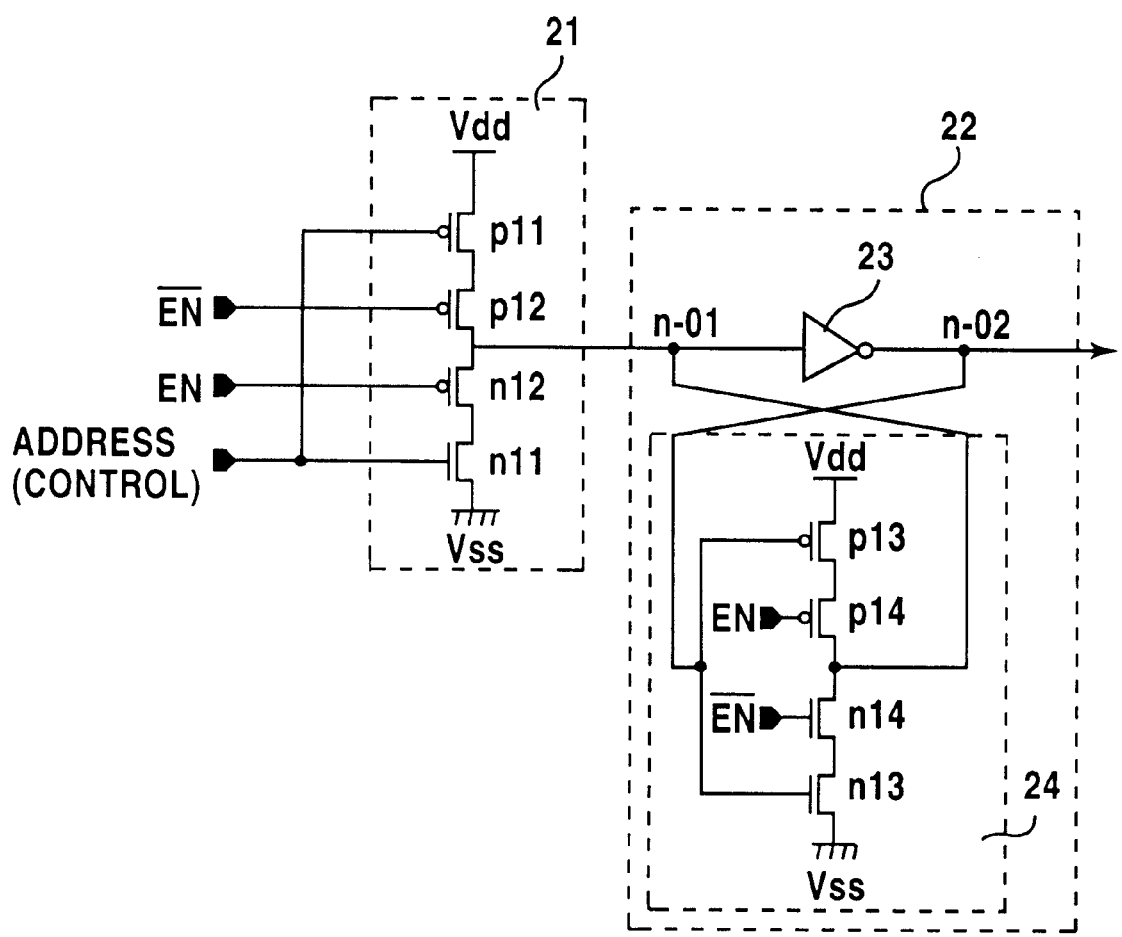
FIG. 4 is a first embodiment of the input buffer of the present invention.

FIG. 4 is a circuit diagram illustrating the first embodiment of the input buffer of the present invention.

In FIG. 4, numeral 21 designates an input circuit; 22, a latch circuit; 23, a first inverter; 24, a second inverter; P11 to P14, PMOS transistors; n11 to n14, NMOS transistors, respectively.

The input circuit 21 includes the CMOS inverter comprised of the PMOS transistor P11 and NMOS transistor n11 connected in series between the high voltage power supply line Vdd and low voltage power supply line Vss (GND). An input node, which is connected to both of a gate of the PMOS transistor P11 and a gate of the NMOS transistor n11 which are connected to the external terminal. And an input signal (address signal, control signal or data signal) is applied to this external terminal. The input signal has CMOS level (typically, having the amplitude of Vdd to Vss).

This input circuit 21 includes a PMOS transistor P12 and a NMOS transistor n12 connected in series. The gates of these transistors P12, n12 receive activation signals /EN, EN. These activation signals /EN, EN are complementary signals. When EN is a high (H) level (/EN is an L level signal), both PMOS transistor P12 and NMOS transistor n12 assume a turn ON state to activate the input circuit 21. Thereby, the CMOS inverter inverts the logic level of the input signal and outputs the inverted logic level to the output node n-01.

On the other hand, when the EN is an L level (/EN is an H level), both PMOS transistor P12 and NMOS transistor n12 turn to an OFF state and thereby the input circuit 21 is in the inactive condition. On this timing, the connection between the high voltage power supply line Vdd and output node n-01 is cut off by the PMOS transistor P12, while the connection between the low voltage power supply line Vss and output node n-01 is also cut off by the NMOS transistor n12, respectively. Therefore, even when the output node n-01 is at any potential, a current does not flow across the high voltage power supply line Vdd and output node n-01 (and across the low voltage power supply line Vss and the output node n-01) to decrease current consumption.

The output node n-01 of the input circuit 21 is connected to the latch circuit 22. This latch circuit 21 is comprised of a first CMOS inverter 23 connected in its input to the output node n-01 and a second CMOS inverter 24 connected in its input and output to the output and the input of the first CMOS inverter 23.

The second CMOS inverter 24 includes a PMOS transistor P13 and a NMOS transistor n13 connected in series between the high voltage power supply line Vdd and low voltage power supply line Vss. The input of the second CMOS inverter 24, which is a common gate node of the PMOS transistor P13 and NMOS transistor n13, is connected to the output of the first CMOS inverter 23.

The second CMOS inverter 24 further includes a PMOS transistor P14 and a NMOS transistor n14 which are connected in series to the PMOS transistor P13 and NMOS transistor n13. The gates of these transistors P14, n14 receive the activation signals EN and /EN respectively.

When the activation signal EN is in at an L level, both PMOS transistor P14 and NMOS transistor n14 turn ON and the latch circuit 22 latches the signal appearing on the output node n-01. On the other hand, when the activation signal EN is at an H level, both PMOS transistor P14 and NMOS transistor n14 turn OFF and the second inverter 24 is in the inactive condition and the latch circuit 22 is in the non-latch condition.

The input buffer circuit of FIG. 4 operates as explained below in response to the activation signals EN, /EN.

When the activation signal EN is at an H level (/EN is at an L level), the input circuit 21 becomes active and provides the output to the output node n-01 by inverting the logic level of the input signal. On this timing, since the second CMOS inverter 24 is inactivated, the latch circuit 22 realizes a non-latch condition and the first CMOS inverter 23 provides an output to the node n-02 by inverting the logic level of the signal at the output node n-01.

Next, since the activation signal EN changes to an L level from the an H level, the input circuit 21 becomes inactive. As explained above, a current does not flow between the voltage power supply line Vdd/Vss and the output node n-01. On the other hand, since the activation signal EN becomes an L level, the second CMOS inverter 24 becomes active and the latch circuit 22 latches the signal at the output node n-01. In this case, the output node n-01 and the power supply line Vdd (or Vss) are connected via the PMOS transistors P13, P14 (or NMOS transistors n13, n14). But since the output node n-01 is connected to the power supply line Vdd having the same potential as the output node n-01, a current does not flow between the output node n-01 and power supply line Vdd.

The activation signal EN is generated as explained later based on the internal clock signal iclk. And the internal clock signal iclk is generated based on the external clock signal CLK. Therefore, the latch circuit 22 latches the input signal in synchronization with the external clock signal CLK.

While the latch circuit 22 latches the input signal, the input circuit 21 assumes an inactive condition and a current does not flow during this period. As explained above, current consumption of the input circuit 21 is thereby reduced.

Active/inactive conditions of this input circuit 21 is controlled by the activation signals EN, /EN generated by an activation signal generating circuit.

Figure 5:
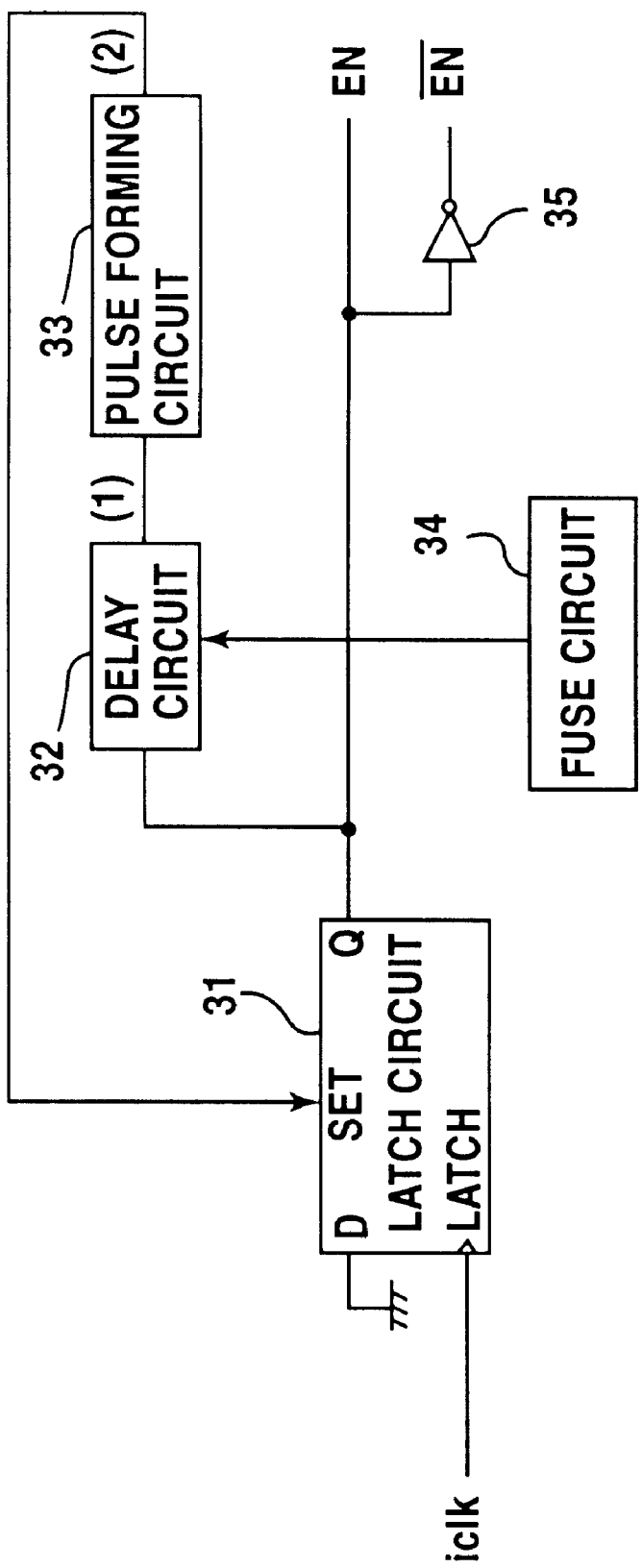
FIG. 5 is a first embodiment of the activation signal generating circuit of the present invention.

FIG. 5 illustrates the first preferred embodiment of the activation signal generating circuit of the present invention.

The activation signal generating circuit in FIG. 5 is comprised of a latch circuit 31, a delay circuit 32, a pulse forming circuit 33, a fuse circuit 34 and an inverter 35.

The latch circuit 31 latches the L level signal of the data input terminal D in response to a rise of the internal clock iclk and outputs the L level activation signal EN from a data output terminal Q. The inverter 35 inverts the logic level of the activation signal EN to output the inverted activation signal /EN. Moreover, the latch circuit 31 sets the signal at the data output terminal Q to the H level in response to a set signal set.

The delay circuit 32 delays the activation signal output from the latch circuit 31 for the predetermined period. Delay time of the delay circuit 32 can be set by programming the fuse circuit 34 to the predetermined value on the basis of a test result before delivery of SDRAM.

The pulse forming circuit 33 generates the set pulse having the pulse duration having a predetermined period in response to a rise of the output signal of the delay circuit 32. When this set pulse is input to the set terminal set of the latch circuit 31, the latch circuit 31 is set as explained above.

Figure 6:
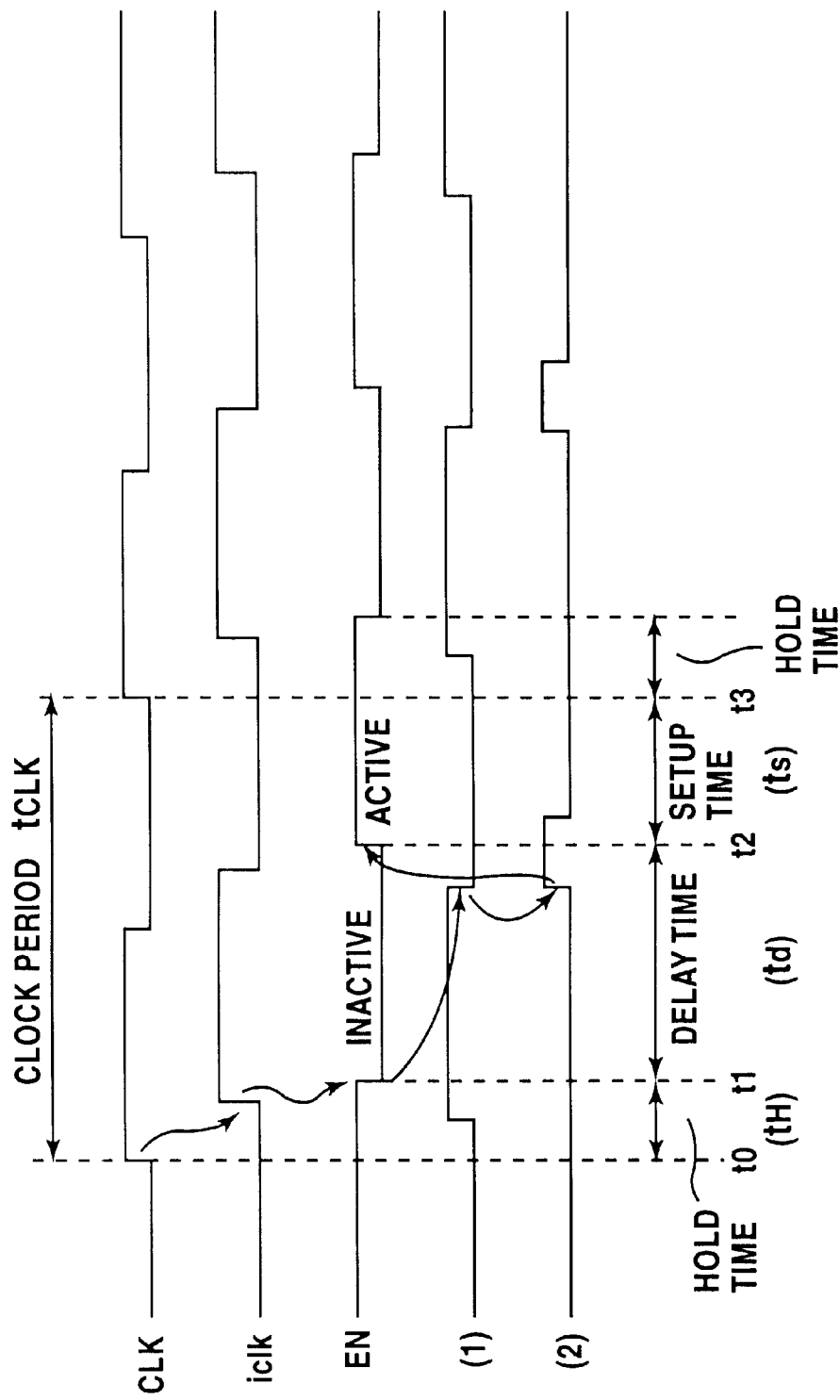
FIG. 6 is a timing diagram of the activation signal generating circuit of FIG. 5.

FIG. 6 is a timing diagram of the activation signal generating circuit shown in FIG. 5. Using FIG. 6, the operations of the activation signal generating circuit in FIG. 5 will be explained.

The clock buffer 11 in FIG. 3 generates the internal clock iclk in response to the input external clock CLK. The clock buffer 11 amplifies the external clock CLK having a low amplitude to generate the internal clock iclk having a high amplitude of a CMOS level. The phase of the internal clock iclk is delayed for the predetermined period from the phase of the external clock CLK as illustrated in FIG. 6 by buffering the external clock CLK at the clock buffer 1

In response to rise (time t1) of the internal clock iclk, the latch circuit 31 latches the L level at the data input terminal D to output the L level activation signal EN to the data output terminal D. Thereby, the input circuit 21 of FIG. 4 becomes inactive.

As is obvious from FIG. 6, the delay time (time difference between the external clock CLK and the internal clock iclk: t1-t0) in the clock buffer corresponds to the hold time $t_H$ of the input buffer of FIG. 4. In the example of FIG. 4, delay time in the clock buffer is almost equal to or longer than the hold time required for the input circuit of the SDRAM. Therefore, the input circuit 21 of the input buffers shown in FIG. 4 is activated for the period longer or identical to the hold time.

The rise timing of the activation signal EN is delayed, as illustrated in FIG. 6, for the predetermined period by the delay circuit 32. When the potential at the output node ① of the delay circuit 32 falls to an L level from an 14 level (time t2), the pulse forming circuit 33 outputs the set pulse which becomes an H level for the predetermined period to the node ②.

In response to the set pulse, the data output terminal Q of the latch circuit 31 is set to the H level and thereby, since the activation signal EN changes to the H level, the input circuit 21 of FIG. 4 is activated. The period from transition of the activation signal (low to high) until the next rise of the external clock is set, as explained later, equal to or longer than the set-up time ts of the input circuit required when the SDRAM operates under the maximum clock frequency.

Figures 7, 8:
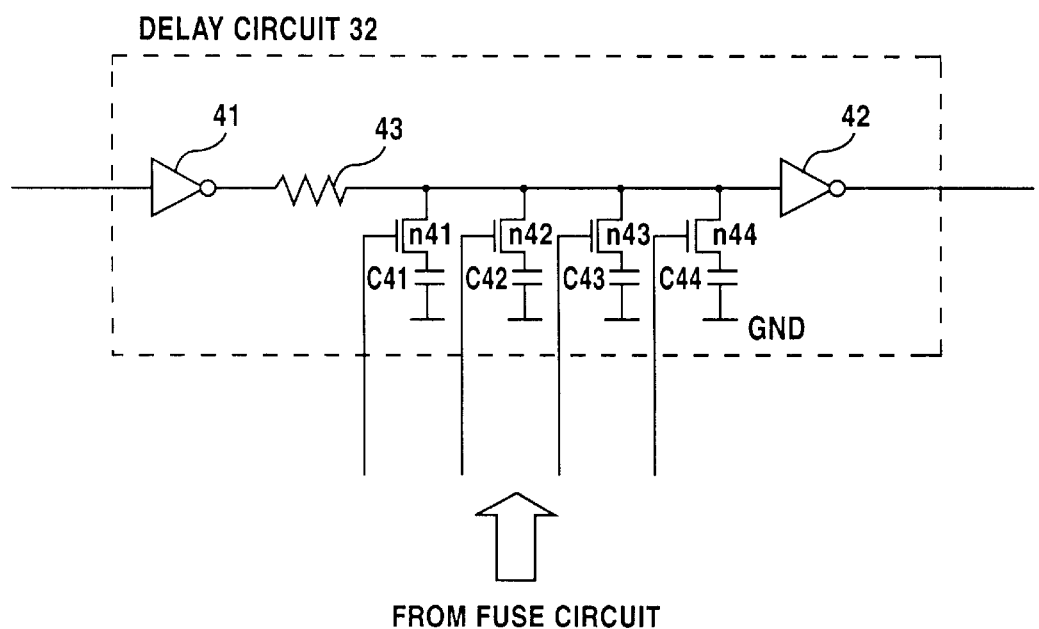
FIG. 7 is a diagram illustrating an example of the relationships among the CAS latency, maximum clock frequency and setup time/hold time.
FIG. 8 is a first embodiment of the delay circuit of the present invention.

FIG. 7 explains one example of the relationship among CAS latency, maximum clock frequency, setup time ts and hold time $t_H$ in the SDRAM.

In FIG. 7, it can be understood that as the value of CAS latency increases, the maximum clock frequency of the input external clock CLK becomes higher. Namely, when CAS latency is 1, the maximum clock frequency is 33 MHz. While, when CAS latency is 3, the maximum clock frequency becomes 100 MHz. Meanwhile, in the example of FIG. 7, values of the setup time and hold time becomes the constant value 2 ns, not depending on the value of CAS latency.

The values 2 ns as the setup time and hold time in FIG. 7 are the catalog values. On the other hand, the actual values of the setup time and hold time of the input circuit are usually shorter than this catalog value. However, in the following explanation, the value 2 ns as the catalog value is used for the convenience of explanation for the setup time and hold time.

From FIG. 7, it can be understood that the required setup time ts is 2 ns, not depending on the external clock frequency. In other words, the activation signal EN must change to the active condition at least 2 ns (or more precisely, the time shorter than 2 ns which is required as the setup time of the input circuit) before the rise timing of the external clock CLK.

Returning to FIG. 6, it can also be understood that the period $t_{CLK}$ of the external clock CLK is almost equal to the sum of the delay time in the delay circuit 32 (t2−t1=td) and the time (t3−t2) from the reset of the latch circuit 31 until the next rise of external clock CLK.

In the example of FIG. 7, 2 ns is respectively required for the setup time and hold time. Therefore, when the delay time (t1−t0) of the clock buffer is set to the hold time (2 ns) and the time (t3−t2) from the reset of latch circuit 31 to the next rise of external clock CLK is set to the setup time (2 ns), the delay time in the delay circuit 32 may be set to the value which is equal to that obtained by subtracting 2 ns+2 ns=4 ns from the period of the external clock CLK. Meanwhile, since the minimum clock period of the external clock CLK is 10 ns from FIG. 7, the delay time of the delay circuit 32 may be set to 10 ns−4 ns=6 ns.

As explained above, when the delay time of the delay circuit 32 is set to 6 ns while the frequency of external clock is 100 MHz (period: 10 ns), the activation time of the activation signal EN becomes 4 ns, which is almost equal to the minimum time required for activation of the input circuit 21 in FIG. 4 (setup time 2 ns+hold time 2 ns=4 ns) and thereby the current consumption in the input circuit 21 can be minimized.

Meanwhile, when the frequency of external clock is 33 MHz (period: 30 ns), since the delay time of the delay circuit in the first embodiment of the activation signal generating circuit is fixed to 6 ns, the activation period of activation signal becomes 30 ns−6 ns=24 ns which is considerably longer than 4 ns at least required for activation of the input circuit 21. However, since the input circuit 21 can be inactivated for 6 ns among 30 ns of one period of the external clock CLK, current consumption of the input circuit 21 can be reduced in comparison with the input circuit of the related art.

As explained above, as the frequency of external clock CLK becomes higher (its period becomes shorter), current consumption of the input circuit 21 can be reduced more effectively. Since the shorter activation period of the activation signal EN can be obtained in the higher clock frequency in the first embodiment of the present invention.

Moreover, in the first embodiment, it is important to set the delay time of delay circuit 32 in such a manner that the activation period of the activation signal EN includes the setup time and hold time required by the input circuit when the external clock CLK is at a maximum frequency and such delay time becomes as near as possible to the total time of the setup time and hold time.

In the example of FIG. 7, the delay time of delay circuit 32 is set to 6 ns as explained above in response to the maximum clock frequency 100 MHz. If the delay time of delay circuit 32 is set longer than 6 ns, the accurate operation of SDRAM is no longer assured because the activation time of the activation signal EN becomes shorter than the sum (4 ns) of the setup time and hold time which is required by the input circuit when the frequency of the external clock CLK is 100 MHz.

FIG. 8 illustrates the first embodiment of the delay circuit 32 in the activation signal generating circuit in FIG. 5.

In FIG. 8, numerals 41, 42 designate CMOS inverters; 43, a resistor; n41 to n44, NMOS transistors; c41 to c44, capacitors, respectively.

The delay circuit 32 of FIG. 8 forms the CR delay circuit which is combination with the resistor 43 and capacitors c41 to c44. In the figure, four capacitors c41 to c44 are respectively connected in series with the corresponding NMOS transistors between the resistor 43 and the ground line GND. The inverter 41 is provided to isolate the delay circuit 32 from the load in the input side of the inverter 41, while the inverter 42 to isolate the delay circuit 32 from the load in the output side of the inverter 42. Thereby, the delay circuit can accurately control the delay value with the resistor 43 and capacitors c41 to c44.

In FIG. 8, control signals are input from the fuse circuit 34 to the gates of the four NMOS transistors n41 to n44. The ON/OFF state of the NMOS transistors n41 to n44 are controlled by the control signals to select the number of capacitors to be connected to the resistor 43.

As explained above, the delay time of delay circuit 32 can be adjusted by selecting the number of capacitors. The capacitors c41 to c44 may have the identical capacitance values but may also be set to provide the ratio of 1:2:4:8.

In FIG. 8, four capacitors and NMOS transistors are illustrated but the number of these elements is not limited to this number.

Figure 9:
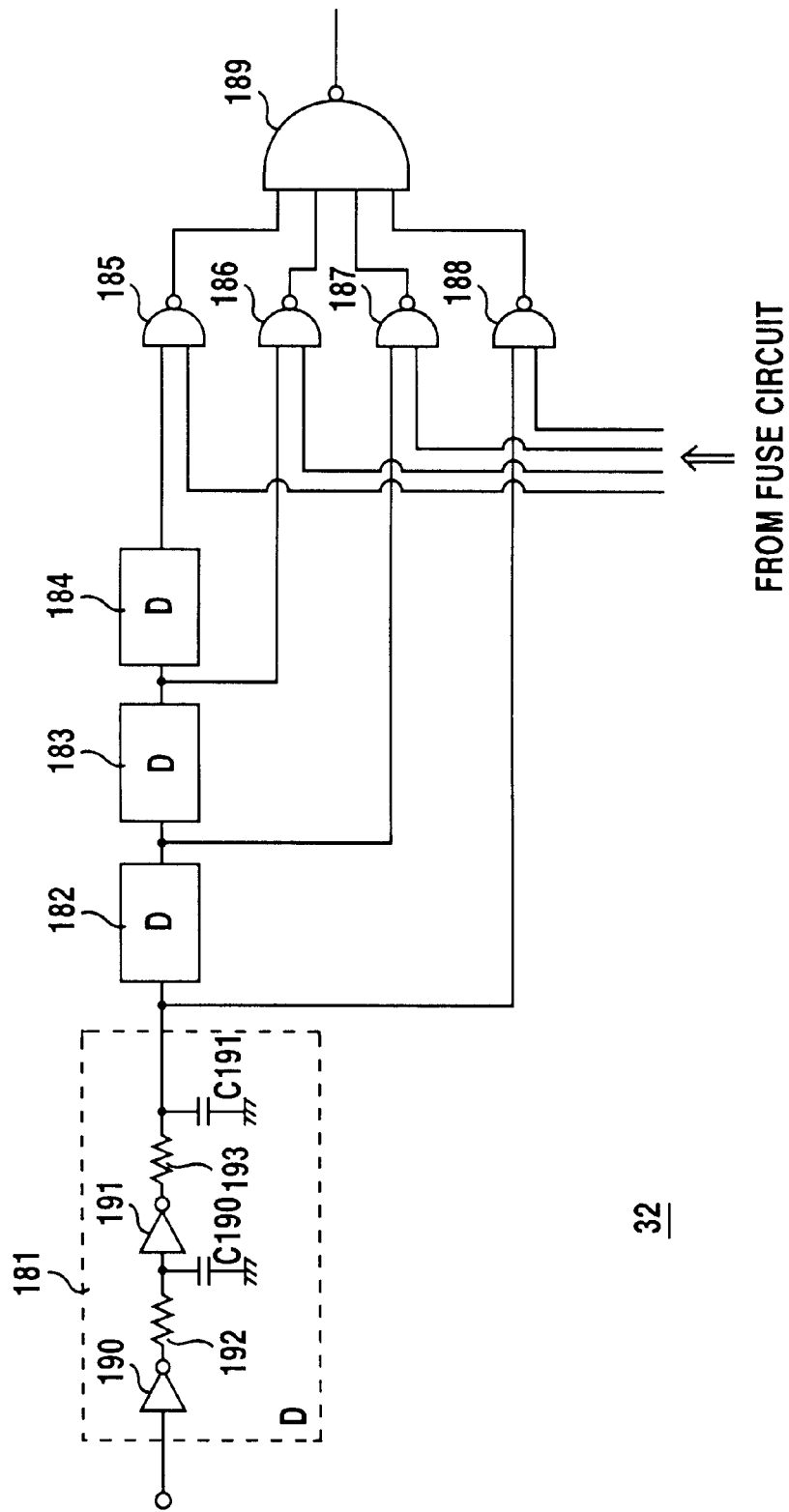
FIG. 9 is a second embodiment of the delay circuit of the present invention.

FIG. 9 illustrates the second embodiment of the delay circuit 32 of the present invention.

In FIG. 9, numerals 181 to 184 designate delay units; 185 to 189, NAND gates; 190, 191, CMOS inverters; 192, 193, resistors and C190, C191, capacitors, respectively.

The delay unit 181 is formed of the serially connected two inverters 190, 191 and the CR delay circuits consisting of resistors and capacitors connected to the output terminals of respective inverters. The other delay units 182 to 184 are also formed in the identical structure of the delay unit 181. However, the practical circuit of the delay unit of FIG. 9 is only an example and the delay unit is not limited to this structure.

Four delay units 181 to 184 are connected in series and four delay signals having different delay times can be obtained from the output terminals of the delay units. Four NAND gates 185 to 188 are connected to the output terminals of the corresponding delay units. In each NAND gate, one of two inputs is connected to the output terminal of the corresponding delay unit and the other is connected to the fuse circuit. Moreover, the NAND gate 189 receives the outputs of the four NAND gates 185 to 188.

The signal having four bits is output from the fuse circuit. Among this 4-bit signal, only one bit is in the H level and the other three bits are in the L, level. For example, when the H level signal is output from the fuse circuit for the NAND gate 185, the delay signal appearing at the output terminal of the delay unit 184 is output to the pulse forming circuit 33 in FIG. 5 via the NAND gates 185 and 189. On the other hand, the delay signals from the output terminals of the other delay units 181 to 183 are impeded respectively at the corresponding NAND gates 186 to 188.

As explained above, only one among four delay signals having different delay times can be selected by the signal from the fuse circuit. In FIG. 9, four delay units and four 2-input NAND gates are used but these elements are not limited thereto.

Figure 10:
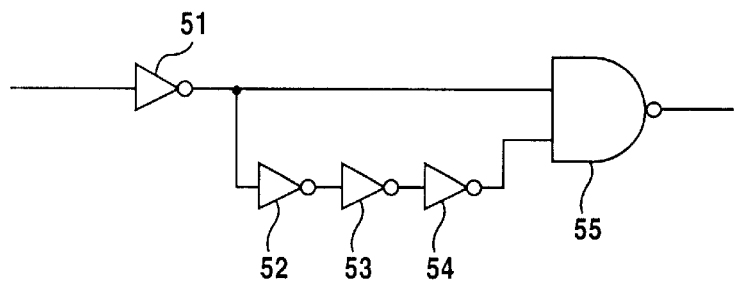
FIG. 10 is a first embodiment of the pulse forming circuit of the present invention.

FIG. 10 is one example of the pulse forming circuit 33 in the activation signal generating circuit in FIG. 5.

In FIG. 10, numerals 51–54 designate CMOS inverters and 55, an AND gate. The one input terminal of the AND gate 55 is connected to the inverter 51 directly, while the other input terminal is connected to the inverter 51 via the inverters 52 to 54.

Thereby, when the input signal of inverter 51 changes to the L level from an H level, an output of the NAND gate 55 becomes an H level and thereafter an output of the NAND gate 55 becomes an L level after the delay times of the inverters 52 to 54. As explained above, the H pulse is output in response to transition of the input signal to the L level from the H level. In this case, the duration of this H level corresponds to the sum of the delay times of the inverters 52 to 54.

Figure 11:
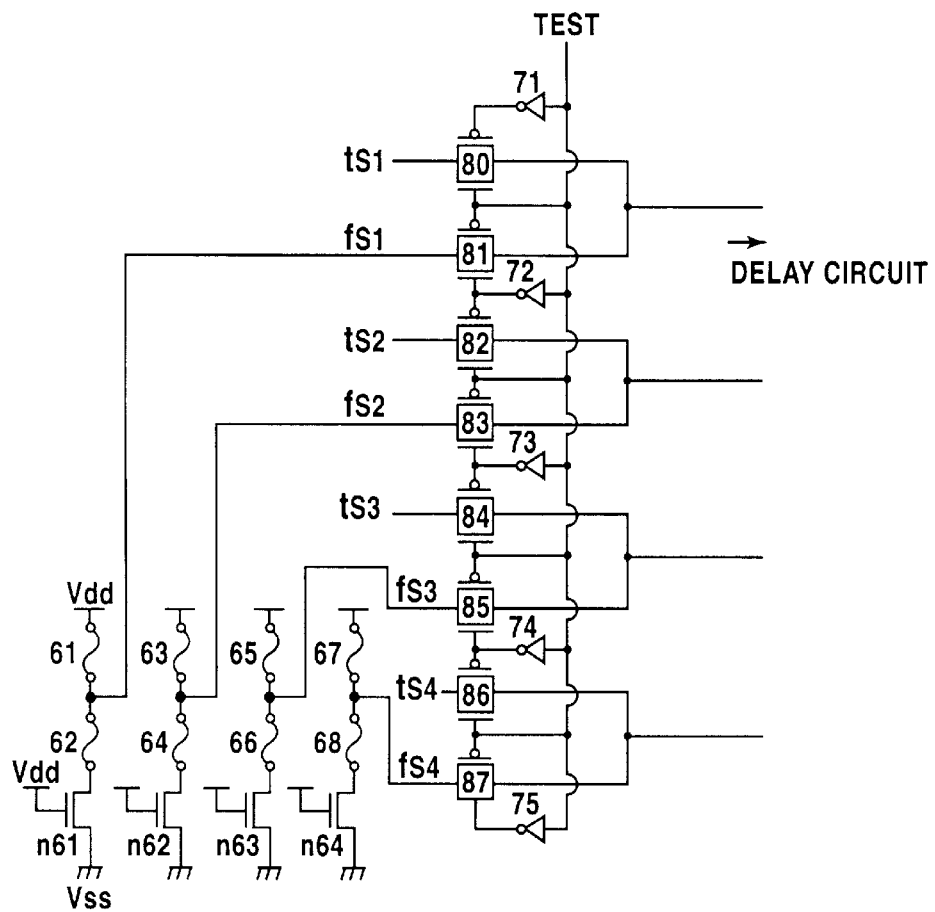
FIG. 11 is a first embodiment of the fuse circuit of the present invention.

FIG. 11 illustrates an example of the fuse circuit 34 in the first embodiment of the activation signal generating circuit in FIG. 5.

In FIG. 11, numerals 61 to 68 designate fuses; n61 to n64, NMOS transistors; 71 to 75, inverters; 80 to 87, transfer switches; TEST, a test control signal; ts1 to ts4, test setting signals; fs1 to fs4, delay setting signals, respectively.

The fuses 61 to 62 are polysilicon fuses which are connected in series between the high voltage power supply line Vdd and low voltage power supply line Vss (GND). Moreover, an NMOS transistor n61 of which the gate is connected to the high voltage power supply line Vdd is provided in series with the fuses. The transistor n61 is provided to suppress the through current flowing across the power supply lines via the fuses 61 and 62 in the non-program condition in which the fuses 61 and 62 are not blowing and therefore this transistor n61 has a large internal resistance.

When programming is conducted, any one of the fuses 61 and 62 is blown, for example, by a means such as laser or the like. Thereby, 0(L) or 1(H) is programmed and thereby a delay setting signal fs1 is output from the connection node between the fuses 61 and 62.

The fuses 63 to 68 and NMOS transistors n62 to n64 are also structured in the same manner and as a result, the delay setting signals having 4 bits fs1 to fs4 can be generated by programming the fuses 61 to 68.

On the other hand, ts1 to ts4 are test setting signals. The delay time characteristic of the delay circuit 32 is measured with this test setting signal before the delay time of the delay circuit 32 is set by programming the fuses 61 to 68. Once the fuses 61 to 68 are programmed, resetting of the delay time of delay circuit 32 is difficult. Therefore, the delay characteristic of delay circuit 32 is measured previously by inputting the test setting signals ts1 to ts4 before the programming of fuses.

These test setting signals ts1 to ts4 can be input to the particular address input terminals simultaneously with application, for example, of the test command to SDRAM.

The test control signal TEST becomes an H level in response to the test command. Numerals 80 to 87 designate transfer switches which are respectively composed of a pair of transistors comprising a PMOS transistor and an NMOS transistor.

When the test control signal TEST becomes an 11 level, the transfer switches 80, 82, 84 and 86 among a plurality of switches turn ON and switches 81, 83, 85 and 87 turn OFF. Thereby, the test setting signals ts1 to ts4 are output to the delay circuit 32. A delay characteristic of delay circuit 32 can be obtained by measuring the delay time of the delay circuit 32.

Thereafter, the delay setting signals fs1 to fs4 can be output to the delay circuit 32 via the transfer switches 81, 83, 85 and 87 by returning the test control signal to the L level and then programming the fuses 61 to 68 to the adequate value, considering the maximum clock frequency used, setup time, hold time and delay characteristic of delay circuit 32.

Figure 12:
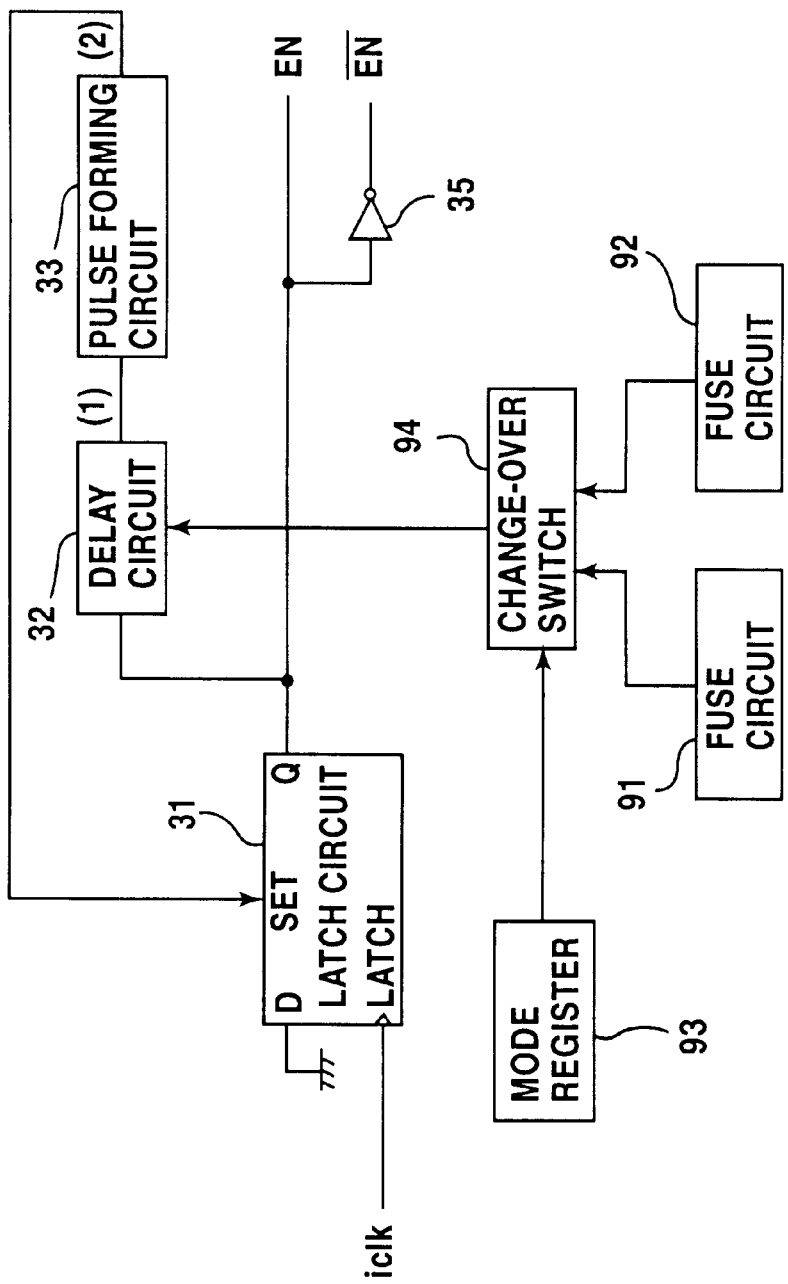
FIG. 12 is a second embodiment of the activation signal generating circuit of the present invention.

FIG. 12 illustrates the second embodiment of the activation signal generating circuit of the present invention.

The second embodiment of FIG. 12 is different from the first embodiment of FIG. 5 in that one set of fuse circuit 1 is provided in the first embodiment but in the second embodiment, two sets 91, 92 of fuse circuits are provided in the second embodiment. Accordingly, one of the outputs of the fuse circuits 91 and 92 is selected depending on the value of a CAS latency set in the mode register 93 and is then supplied to the delay circuit 32.

The other structure is similar to the first embodiment in FIG. 5 and the same structural elements are designated by the same numerals and explanation of operations is omitted here.

In the first embodiment in FIG. 5, delay time of the delay circuit 32 is fixed, for example, to 6 ns. The delay time of 6 ns is selected to provide the minimum current consumption of the input circuit (of the address/control circuit) under the condition that the CAS latency is set to 3 in FIG. 7 and the external clock frequency used is set to 100 MHz which is the maximum value.

Meanwhile, as explained above, in the first embodiment, when the delay time of delay circuit 32 is set to 6 ns, if the SDRAM user sets 2 as the CAS latency and uses a 66 MHz external clock, the activation time of the activation signal becomes 11 ns. This activation time 11 ns is considerably long in comparison with the minimum activation time 2 ns+2 ns=4 ns of the input circuit and the input circuit consumes useless current during the period of 11 ns−4 ns=7 ns.

Therefore, in the second embodiment, the delay time of delay circuit 32 can be selected in response to the preset CAS latency value, by realizing that the maximum frequency of an external clock has a relationship with the preset CAS latency value.

For example, the fuse circuit 91 is programmed such that the delay time of the delay circuit 32 becomes 6 ns in response to the settings of CAS latency=3, maximum clock frequency=100 MHz and setup time=hold time=2 ns in FIG. 7.

On the other hand, the fuse circuit 92 is programmed such that the delay time of the delay circuit 32 is 11 ns in response to the settings of CAS latency=2, maximum clock frequency=66 MHz, setup time=hold time=2 ns in FIG. 7.

When the CAS latency is set to 3 in the mode register 93, the change-over switch 94 supplies an output (delay setting signal) of the fuse circuit 91 to the delay circuit 32 to set the delay time of the delay circuit 32 to 6 ns.

Meanwhile, when the CAS latency is set to 2 or 1 in the mode register 93, the change-over switch 94 supplies an output (delay setting signal) of the fuse circuit 92 to set the delay time of the delay circuit 32 to 11 ns.

According to the second embodiment of the present invention, when CAS latency is set to 2 (maximum clock frequency: 66 MHz), the activation time of the activation signal can be shortened to 4 ns and current consumption of the input circuit can be more reduced than that in the first embodiment.

Figure 13:
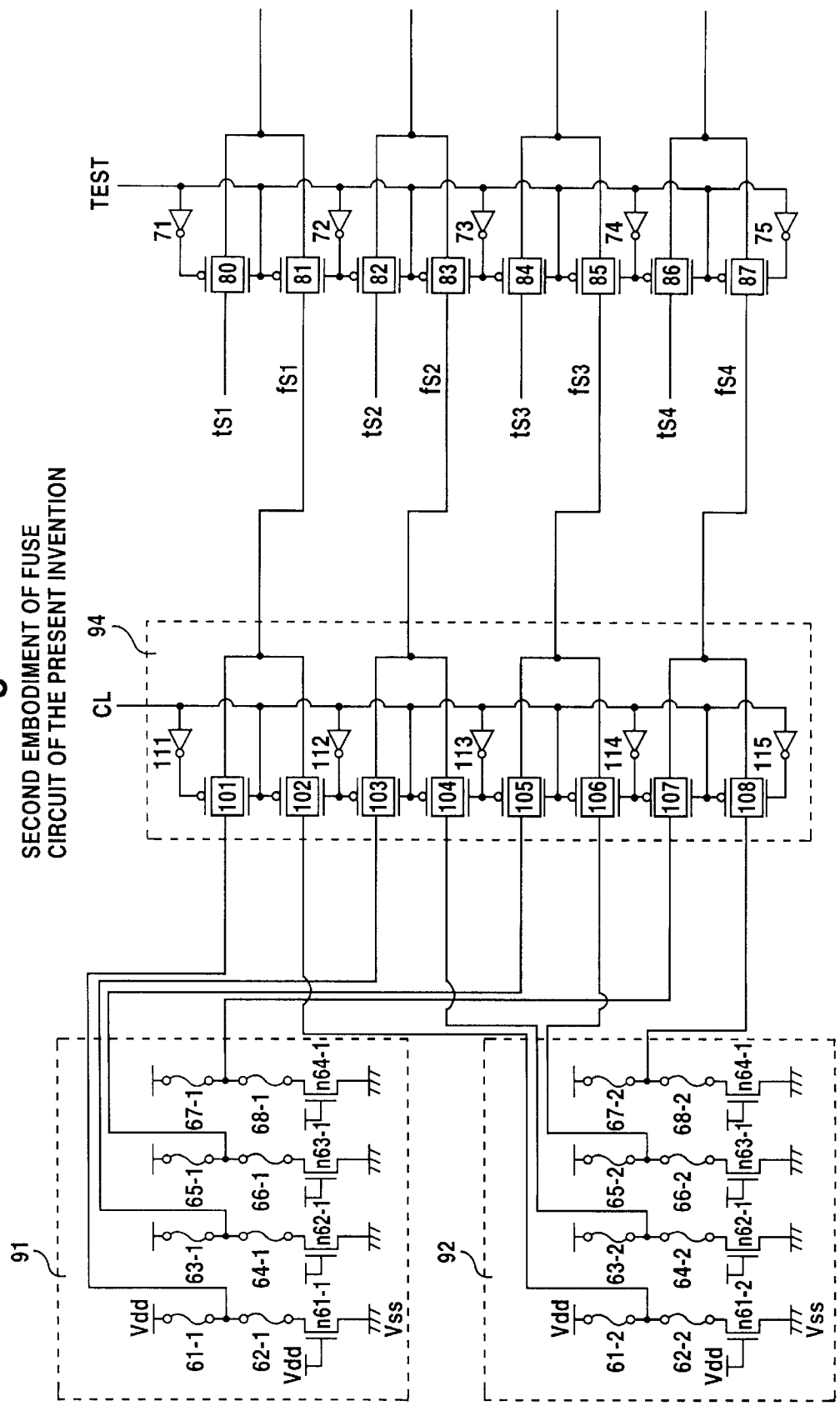
FIG. 13 is a second embodiment of the fuse circuit of the present invention.

FIG. 13 illustrates an example of the fuse circuits 91, 92 and change-over switch 94 in the second embodiment of the activation signal generating circuit of the present invention of FIG. 12.

The structure of the fuse circuits 91 and 92 is similar to that of the fuses 61 to 68 and NMOS transistors n61 to n64 in FIG. 11. Moreover, the structure of the transfer switches 80 to 87 and inverters 71 to 75 for switching the test setting signals ts1 to ts4 and delay setting signals fs1 to fs4 in FIG. 13 is also similar to the structure illustrated in FIG. 11.

Figure 1:
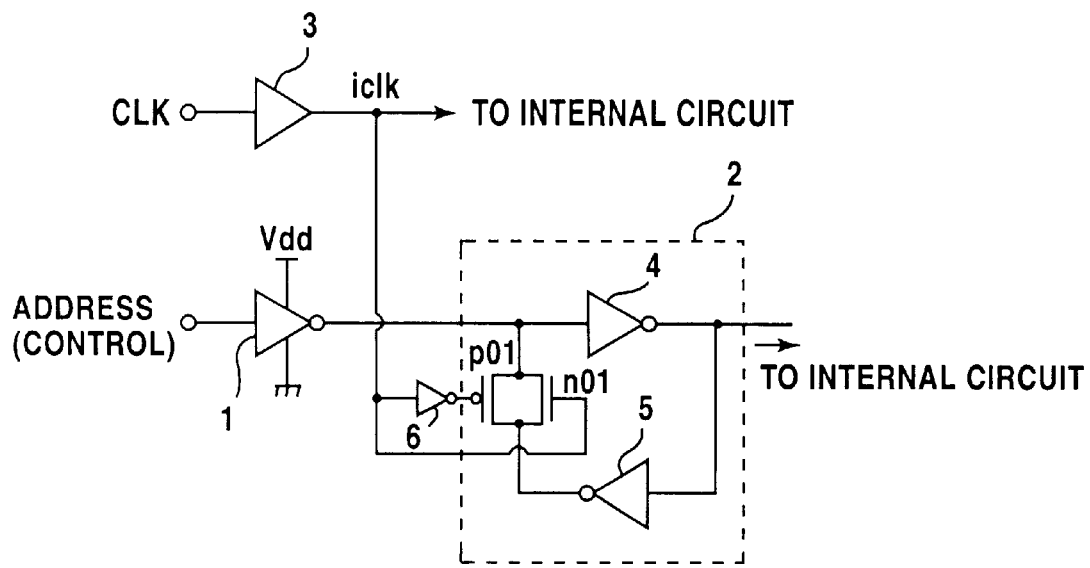
FIG. 1 is a circuit diagram of an input buffer circuit.
Figure 2:
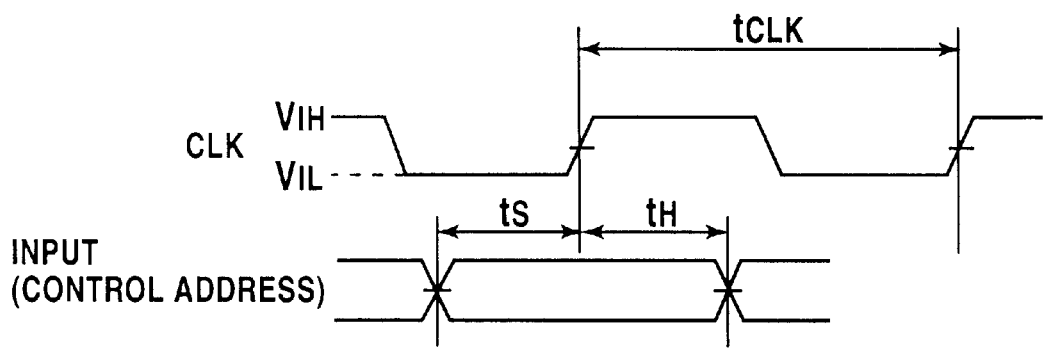
FIG. 2 is a timing diagram indicating setup time and hold time.

Numeral 94 in FIG. 1 3 illustrates the structure of a change-over switch. This change-over switch is comprised of the transfer switches 101 to 108 and inverters 111 to 115. When the CAS latency signal CL is in the H level from the mode register 93, the transfer switches 101, 103, 105 and 107 of a plurality of transfer switches turn ON and the delay setting signal from the fuse circuit 91 is then output to the delay circuit 32. On the other hand, when the CAS latency signal CL is in the L level, the transfer switches 102, 104, 106 and 108 selectively turn ON and the delay setting signal from the fuse circuit 92 is output to the delay circuit 32.

As explained above, the second embodiment of fuse circuit has a plurality of fuse circuits 91 and 92 and outputs any one of the delay setting signal from the fuse circuit 91 or delay setting signal from the fuse circuit 92 in response to the value of CAS latency signal from the mode register.

In the second embodiment of the activation signal generating circuit in FIG. 12, a couple of fuse circuits 91 and 92 are provided but three fuse circuits may also be provided corresponding to three kinds of CAS latencies in FIG. 7.

Figure 14:
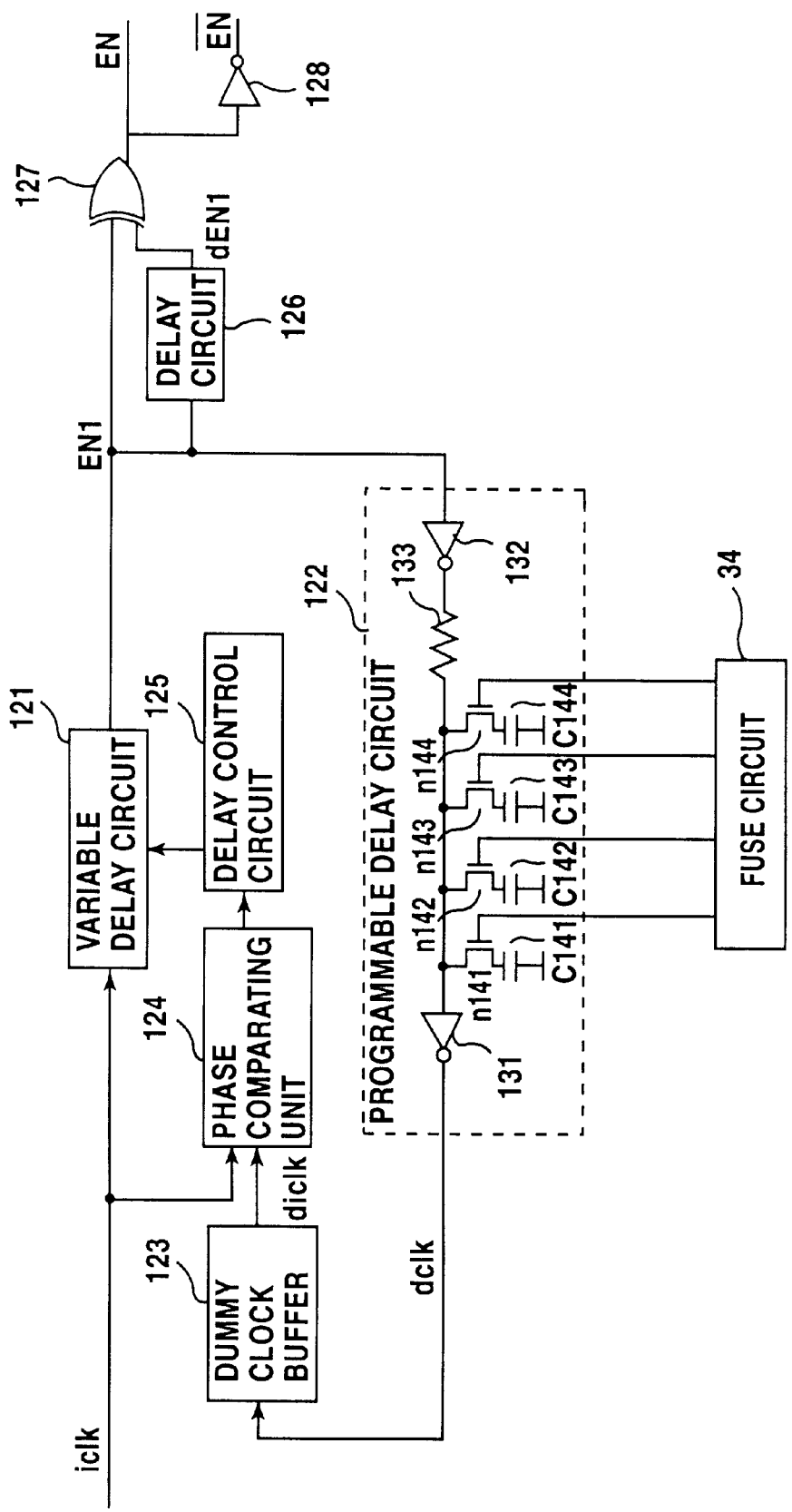
FIG. 14 is a third embodiment of the activation signal generating circuit of the present invention.

FIG. 14 illustrates the third embodiment of the activation signal generating circuit of the present invention.

In the first embodiment of the activation signal generating circuit in FIG. 5, the delay time of delay circuit 22 is fixed and the activation time of activation signal EN changes in response to the frequency of the external clock to be used. In the third embodiment of FIG. 14, on the other hand, the activation time of activation signal EN is controlled to become constant and without relation to or independent of the external clock frequency to be used. Therefore, according to the third embodiment of the activation signal generating circuit of the present invention, the activation time of the (address/control) input circuit can be optimized without relation to the frequency of external clock and thereby current consumption of the input circuit can further be reduced than that in the first and second embodiments.

The activation signal generating circuit of FIG. 14 is comprised of a variable delay circuit 121, a programmable delay circuit 122, a dummy clock buffer 123, a phase comparator 124, a delay control circuit 125, a delay circuit 126, OR gate 127, an inverter 128 and a fuse circuit 34.

Moreover, the programmable delay circuit 122 is comprised of inverters 131, 132, a resistor 133, NMOS transistors n141 to n144 and capacitors c141 to c144.

The variable delay circuit 121 delays the internal clock iclk from the clock buffer for the predetermined time. Delay time in the variable delay circuit changes in response to the frequency of external clock CLK. This delay time in the variable delay circuit is controlled by the programmable delay circuit 122, the dummy clock buffer 123, the phase comparator 124 and the delay control circuit 125 which will be explained later.

The programmable delay circuit 122 delays the output signal EN1 of the variable delay circuit 121 for the predetermined time to generate the delayed clock dclk. Delay time of the programmable delay circuit 122 can be programmed by a setting signal from the fuse circuit 34. Delay time of the programmable delay circuit 122 is programmed to become equal to the setup time of the input circuit of SDRAM. Since the practical structure of the programmable delay circuit 122 is almost identical to that of the first embodiment of the delay circuit in FIG. 8, explanation about its operations will be omitted here.

The dummy clock buffer 123 buffers the delayed clock dclk to output the delayed internal clock diclk. The dummy clock buffer 123 has a delay time which is identical to that of the clock buffer 11 in FIG. 3 which generates the internal clock iclk by buffering the external clock CLK. Therefore, the circuit structure of dummy clock buffer 123 is identical to that of the clock buffer 11.

The phase comparator 124 compares the phase of internal clock iclk with the phase of the delayed internal clock diclk from the dummy clock buffer. The phase comparison result is sent to the delay control circuit 125. The delay control circuit 125 controls the delay time in the variable delay circuit 121 so that the phase of internal clock iclk is matched with the phase of the delayed internal clock diclk.

The delay circuit 126 generates the delayed activation signal dEN1 by delaying the output signal EN1 of the variable delay circuit 121 for the predetermined period. Delay time of this delay circuit 126 is set to maintain the activated condition of the activation signal EN during the hold time of the input circuit.

The OR gate 127 combines the output signal EN1 from the variable delay circuit 121 and the delayed activation signal dEN1 from the delay circuit 126. Namely, this OR gate 127 expands the activation period of the output signal EN1 as long as the delay time of delay circuit 126.

The output signal of this OR gate 127 becomes the activation signal EN for the input circuit. Moreover, the inverter 128 inverts the logic level of the activation signal EN to generate the inverted activation signal /EN.

Figure 15:
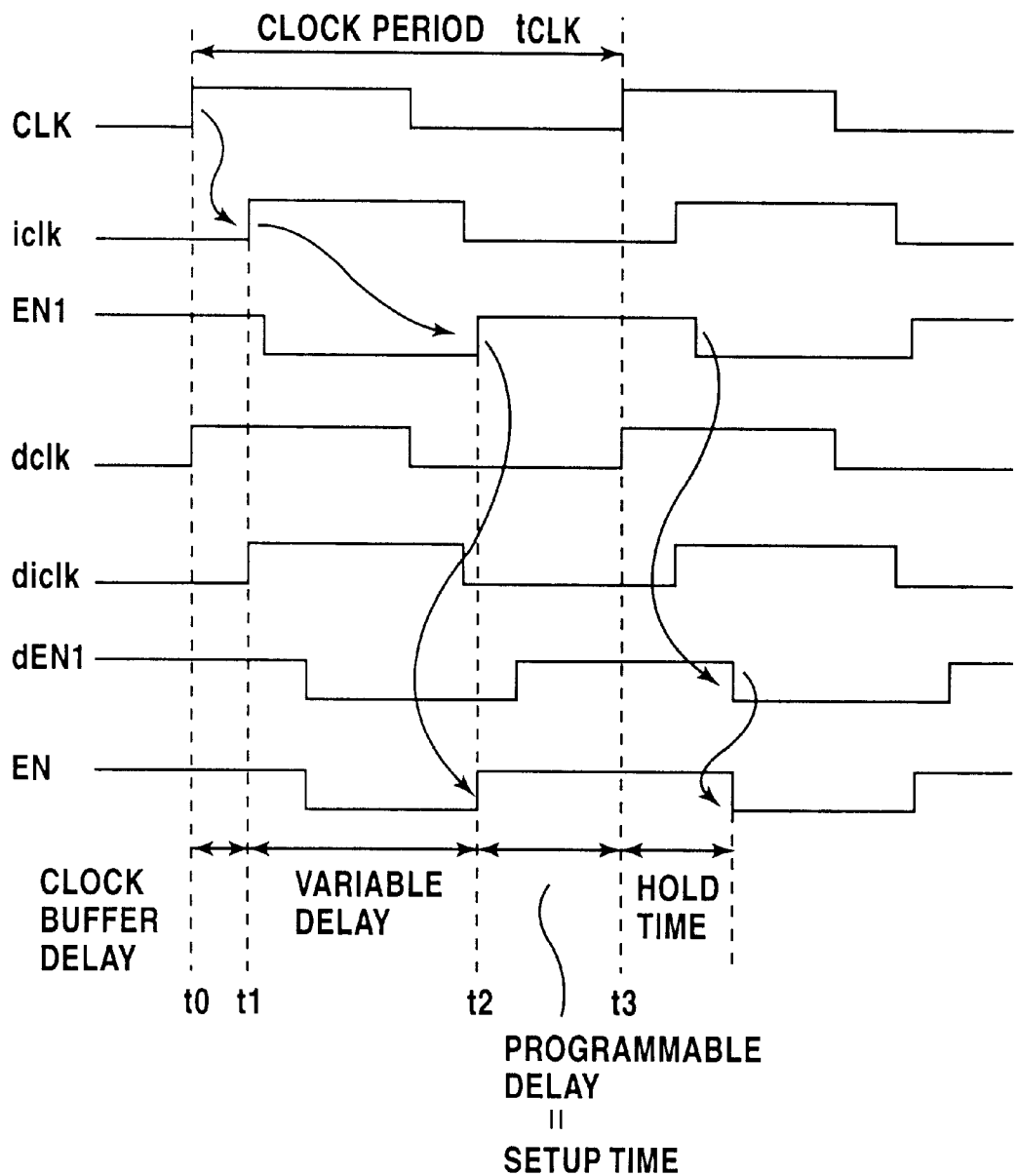
FIG. 15 is a timing diagram of the activation signal generating circuit of FIG. 14.

FIG. 15 is a timing diagram of the activation signal generating circuit in FIG. 14. Using FIG. 15, operations of the activation signal generating circuit in FIG. 14 will be explained.

The clock buffer 11 (refer to FIG. 3) outputs the internal clock iclk after the predetermined delay time by buffering the external clock CLK. The variable delay circuit 121 delays the internal clock iclk for the predetermined time and generates the activation clock signal EN1. When this activation clock EN1 rises to the H level from the L level, the activation signal EN transits to the active condition from non-active condition.

On the other hand, the programmable delay circuit 122 delays the activation clock EN1 for the period corresponding to the setup time of the input circuit to generate the delayed clock dclk. Moreover, the dummy clock buffer 123 delays the delayed clock dclk for the time equal to the same delay time as the clock buffer 11 to generate the delayed internal clock diclk.

The phase comparison circuit 124 compares the phases of the internal clock iclk and the delayed internal clock diclk. A comparison result is then sent to the delay control circuit 125. The delay control circuit 125 controls an amount of delay in the variable delay circuit 121 so that the phase of internal clock iclk is matched with the phase of delayed internal clock diclk.

According to the third embodiment of the activation signal generating circuit, the clock period tCLK of the external clock is controlled to become identical to the sum of the delay time (t1−t0) in the clock buffer (dummy clock buffer), delay time (t2−t1) in the variable delay circuit and delay time (t3−t2) in the programmable delay circuit 122.

Delay time of the programmable delay circuit 122 and delay time of the dummy clock buffer 123 are fixed. When the delay time in the programmable delay circuit 122 is programmed to become identical to the setup time of the input circuit and the delay time in dummy clock buffer is assumed to be identical to the hold time of the input circuit, the activation period (H level period) of the activation clock EN1 becomes equal to the sum of the setup time and hold time of the input circuit and the activation period of this activation clock EN1 becomes constant and thus not dependent on the period of external clock CLK. Namely, when the frequency of external clock CLK changes, delay time in the variable delay circuit 121 also changes depending on such change but delay time in the programmable delay circuit 122 and delay time in the dummy clock buffer 123 do not change. Therefore, the activation period of the activation clock EN1 becomes constant without depending on the frequency of external clock.

When delay time in the clock buffer is equal to or longer than the hold time of the input circuit, the delay circuit 126 and OR gate 127 in FIG. 13 are unnecessary. Meanwhile, when delay time in the clock buffer is shorter than the hold time in the input circuit, since the activation period after rise of the external clock of the activation clock EN1 becomes shorter than the hold time of the input circuit, the delay circuit 126 and OR gate 127 must be provided to extend the activation period of the activation clock EN1.

The delay circuit 126 generates the delay activation signal dEN1 by delaying, for the predetermined period, the activation signal EN1 in view of maintaining the active condition (H level) of the activation signal during the period corresponding to the hold time from the rise timing of the external clock. The OR gate 128 combines the activation clock EN1 and delayed activation signal dEN1, extends the activation period of the activation clock EN1 and then outputs the activation signal EN.

Figure 16:
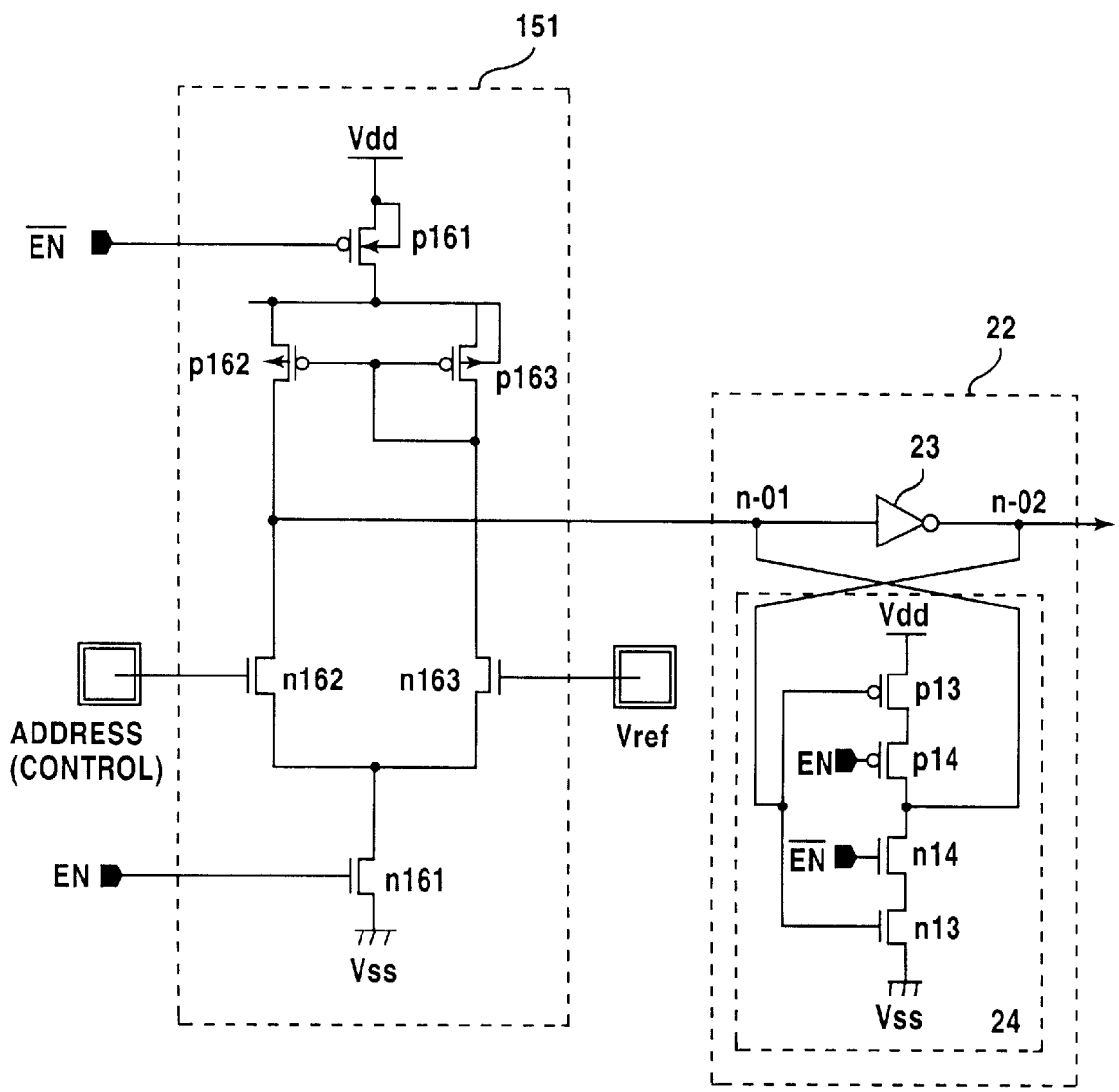
FIG. 16 is a second embodiment of the input buffer of the present invention.

FIG. 16 illustrates the second embodiment of the input buffer in the present invention.

In the first embodiment of FIG. 4, the input circuit 21 is comprised of a CMOS inverter but in the second embodiment in FIG. 16, the input circuit 151 is comprised of a differential circuit with a current miller. The latch circuit 22 has the structure similar to that in the first embodiment.

The input buffer in the second embodiment shown in FIG. 16 is applied when an input signal (address data, control data) has small amplitude such as SSTL level. When the input signal has a low level amplitude having 1 V or less, this input signal must be amplified by the input buffer and is then converted to the CMOS level signal for operation of the internal logic circuit.

The input circuit 151 is comprised of PMOS transistors P161 to P163 and NMOS transistors n161 to n163.

The NMOS transistors n162 and n163 form a differential circuit with the sources connected in common with each other. The gate of the NMOS transistor n162 is connected to the input terminal for receiving the input signal. Moreover, the reference voltage Vref is applied to the gate of the NMOS transistor n163.

The PMOS transistors P162 and P163 form the current Miller circuit. Moreover, the NMOS transistor n161 forms a power supply switch coupled between the differential circuit and low voltage power supply line Vss controlled by the activation signal EN. Moreover, the PMOS transistor P161 forms an another power supply switch coupled between the current Miller circuit and high voltage power supply line Vdd controlled by the inverted activation signal /EN.

In the second embodiment of the input buffer in FIG. 16, a current is prevented from flowing across the power supply lines and output node n-01 and thereby current consumption can be reduced, when the input circuit 151 is in the inactive condition. The power supply switches P161 and n161 are provided respectively between the high voltage power supply line Vdd and output node n-01 and between the low voltage power supply line Vss and output node n-01.

Figure 17:
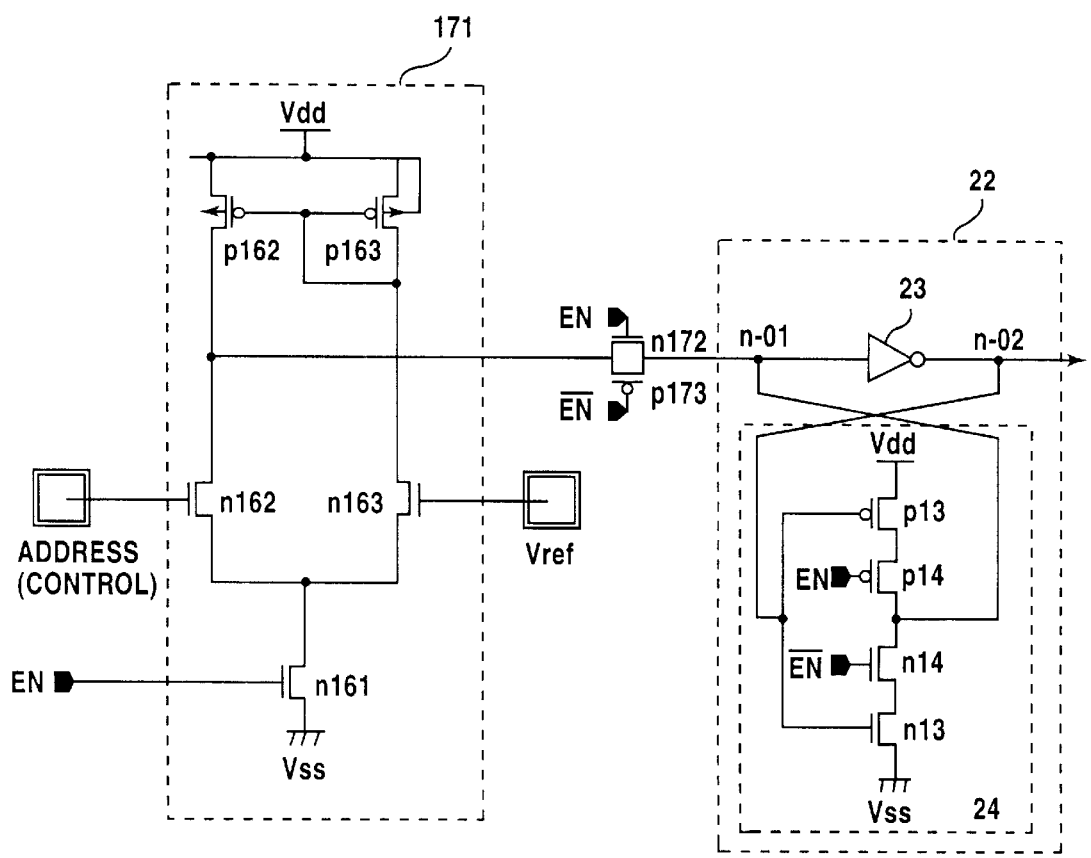
FIG. 17 is a third embodiment of the input buffer of the present invention.

FIG. 17 illustrates the third embodiment of the input buffer of the present invention.

The difference from the second embodiment in FIG. 16 is that the power supply switch P161 is not provided in the input circuit 171 and a transfer switch consisting of a pair of transistors comprising PMOS transistor P173 and NMOS transistor n172 is provided between the input circuit 171 and latch circuit 22.

In the input circuit 151 of the second embodiment in FIG. 16, the PMOS transistors P161 and P162 are connected in series between the high voltage power supply line Vdd and output node n-01. Therefore, the H level at the output node n-01 in the input circuit 51 is set a little lower than Vdd due to an internal resistance of the PMOS transistors P161 and P162.

Accordingly, when the input circuit 151 is inactivated and the latch circuit 22 starts the latch operation under the condition that the output node n-01 is in the H level, a current flows through the route Vdd→P13→P14→n-01, resulting in an increase of current consumption.

On the other hand, in the third embodiment shown in FIG. 17, since the power switch P161 of FIG. 15 is not provided, the H level at the output node n-01 becomes higher than that in the example of FIG. 16. Therefore, current flowing through the route Vdd→P13→P14→n-01 can be lowered when the latch operation starts.

Moreover, current does not flow into the input node n-01 of the latch circuit 22 via the input circuit 171 from the high voltage power supply line Vdd, when the latch circuit 22 starts the latch operation by providing a transfer switch consisting of the PMOS transistor P173 and NMOS transistor n172 between the input circuit 171 and latch circuit 22. Since this transfer switch turns off when the latch circuit 22 starts the latch operation.

In the example in FIG. 17, the input circuit 171 and the transfer switch are controlled in common by the activation signal EN, but the transfer switch may also be controlled by another control signal rather than the activation signal EN. In this case, an output of the second inverter 24 is controlled to assume a high impedance condition in any one of the conditions that the activation signal EN is in the active condition or the transfer switch is in the ON condition.

As explained above, according to the third embodiment of the input buffer in FIG. 17, the current consumption of input buffer may further be reduced than that in the second embodiment.

As is obvious from the explanation of the above embodiments, according to the present invention, an input circuit assuring smaller current consumption can be obtained. Because the activation time of the input circuit is shorter than one period of the external clock CLK and such activation time can be limited to the time equal to the setup time and hold time of the input circuit or to the time including such equal time.

For example, in the first embodiment of FIG. 5, the activation time of the input circuit may be reduced to 4 ns from the existing 10 ns for one period of the external clock by the settings that delay time of the delay circuit is set to 6 ns and external clock frequency to be used is set to 100 MHz (clock period: 10 ns).

We claim:

1. A semiconductor integrated circuit for receiving an input signal in synchronization with a clock signal, comprising:

an input circuit activated by an activation signal to receive said input signal; and an activation signal generating circuit for generating said activation signal, wherein said activation signal generating circuit intermittently activates the activation signal to activate said input circuit for a time shorter than a period of said clock signal and the time includes a setup time and a hold time of said input circuit to a transition edge of the clock signal.

2. The semiconductor integrated circuit as claimed in claim 1, further comprising a latch circuit connected to an output of said input circuit to latch said input signal in response to said clock signal.

3. The semiconductor integrated circuit as claimed in claim 2, wherein said output of said input circuit is in a high impedance condition when said activation signal is in a non-active condition.

4. The semiconductor integrated circuit as claimed in claim 3 wherein said latch circuit comprises:

a first inverter having an input connected to said input circuit; and a second inverter having an input and an output cross-connected to an output and the input of said first inverter for operation in response to said activation signal, wherein the output of said second inverter is in a high impedance condition when said activation signal is in an active condition.

5. The semiconductor integrated circuit as claimed in claim 2, further comprising:

a switch provided between said input circuit and said latch circuit, and said latch circuit comprises:

a first inverter having an input connected to said input circuit via said switch; and a second inverter having an input and an output cross-connected to an output and the input of said first inverter to operate in response to said activation signal, and wherein the output of said second inverter is in a high impedance condition when said activation signal is in an active condition.

6. The semiconductor integrated circuit as claimed in claim 1, wherein said activation signal generating circuit generates said activation signal in response to said clock signal and said activation signal changes to an active condition before said set-up time of said input circuit.

7. The semiconductor integrated circuit as claimed in claim 6 wherein said activation signal generating circuit comprises:

an activation signal latch circuit for changing said activation signal to a non-active condition in response to an internal clock signal which is buffering said clock signal and for changing said activation signal to said active condition in response to a set signal;

a first delay circuit for delaying said activation signal for the predetermined time; and a pulse generating circuit for outputting a pulse signal as said set signal to said activation signal latch circuit in response to transition of an output of said first delay circuit.

8. The semiconductor integrated circuit as claimed in claim 7, wherein a delay time in said first delay circuit can be programmed.

9. The semiconductor integrated circuit as claimed in claim 8, wherein said delay time in said first delay circuit can be switched in response to a CAS latency.

10. The semiconductor integrated circuit as claimed in claim 6 wherein said activation signal generating circuit comprises:

a variable delay circuit for outputting a timing signal obtained by delaying an internal clock signal for a predetermined period;

a second delay circuit for delaying said timing signal for a time corresponding to said setup time;

a dummy clock buffer for buffering an output of said second delay circuit;

a phase comparison unit for comparing phases of said internal clock and an output of said dummy clock buffer; and a delay control circuit for controlling the predetermined time in said variable delay circuit in response to a comparison result of said phase comparing unit, wherein said activation signal is generated from said timing signal.

11. The semiconductor integrated circuit as claimed in claim 1, wherein said input signal is at least one of an address signal, a control signal or a data signal.

12. The semiconductor integrated circuit as claimed in claim 1 characterized in that as the frequency of an external clock increases, current consumption of the input circuit decreases.

* * * * *